(12) United States Patent
Nam et al.

(10) Patent No.: US 11,994,801 B2
(45) Date of Patent: May 28, 2024

(54) SEMICONDUCTOR DEVICE AND METHOD OF COATING A SEMICONDUCTOR WAFER WITH HIGH VISCOSITY LIQUID PHOTORESIST USING N2 PURGE

(71) Applicant: STATS ChipPAC Pte. Ltd., Singapore (SG)

(72) Inventors: Giwoong Nam, Incheon (KR); Junghwan Jang, Incheon (KR); Inhee Hwang, Chungcheongnam-do (KR); Taekyu Choi, Incheon (KR); Sanghyun Park, Gyeongsangnam-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 170 days.

(21) Appl. No.: 17/319,785

(22) Filed: May 13, 2021

(65) Prior Publication Data

US 2022/0365436 A1 Nov. 17, 2022

(51) Int. Cl.
| | | |
|---|---|---|
| *G03F 7/16* | (2006.01) | |
| *B05C 11/06* | (2006.01) | |
| *H01L 21/02* | (2006.01) | |

(52) U.S. Cl.
CPC .............. *G03F 7/168* (2013.01); *B05C 11/06* (2013.01); *G03F 7/162* (2013.01); *G03F 7/164* (2013.01); *H01L 21/0209* (2013.01)

(58) Field of Classification Search
USPC ............................. 118/326, 52, 612, 319, 320
See application file for complete search history.

(56) References Cited

U.S. PATENT DOCUMENTS

| | | | |
|---|---|---|---|
| 5,312,487 A | | 5/1994 | Akimoto et al. |
| 5,529,626 A | * | 6/1996 | Stewart .................. G03F 7/162 |
| | | | 118/50 |
| 6,613,700 B2 | | 9/2003 | Hall et al. |
| 9,120,120 B2 | | 9/2015 | Yamamoto et al. |
| 9,716,002 B2 | | 7/2017 | Takiguchi et al. |
| 2002/0127878 A1 | | 9/2002 | Young et al. |
| 2006/0263520 A1 | | 11/2006 | Kang et al. |
| 2007/0215178 A1 | * | 9/2007 | Yamamoto .......... H01L 21/6715 |
| | | | 134/109 |
| 2015/0114561 A1 | * | 4/2015 | Higashijima ....... H01L 21/6715 |
| | | | 156/345.23 |

* cited by examiner

*Primary Examiner* — Yewebdar T Tadesse
(74) *Attorney, Agent, or Firm* — Robert D. Atkins; PATENT LAW GROUP: Atkins and Associates, P.C.

(57) ABSTRACT

A semiconductor manufacturing device has an outer cup and inner cup with a wafer suction mount disposed within the outer cup. A photoresist material is applied to a first surface of a semiconductor wafer disposed on the wafer suction mount while rotating at a first speed. A gas port is disposed on the inner cup for dispensing a gas oriented toward a bottom side of the semiconductor wafer. The gas port purges a second surface of the semiconductor wafer with a gas to remove contamination. The second surface of the semiconductor wafer is rinsed while purging with the gas. The gas can be a stable or inert gas, such as nitrogen. The contamination is removed from the second surface of the semiconductor wafer through an outlet between the inner cup and outer cup. The semiconductor wafer rotates at a second greater speed after discontinuing purge with the gas.

16 Claims, 9 Drawing Sheets

SEMICONDUCTOR DEVICE AND METHOD OF COATING A SEMICONDUCTOR WAFER WITH HIGH VISCOSITY LIQUID PHOTORESIST USING N2 PURGE

FIELD OF THE INVENTION

The present invention relates in general to semiconductor devices and, more particularly, to a semiconductor device and method of coating a semiconductor wafer with a high viscosity liquid photoresist using N2 purge.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices contain active and/or passive type electrical components. The electrical interconnection of the active and passive electrical components requires formation of electrical interconnect structures, such as trace lines, redistribution lines (RDL), and external contact pads. The formation of active and passive electrical components, as well as the electrical interconnect structures, utilizes a photolithographic process which requires certain areas of the semiconductor wafer to be masked off to perform the semiconductor manufacturing operation, e.g., implantation step or applying conductive material, in the desired area.

Figure 1A:
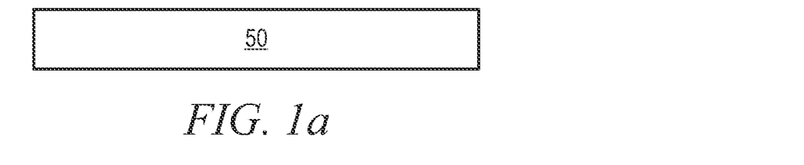
FIGS. 1a-1e illustrate a known photolithographic process using photoresist material.
Figure 1B:
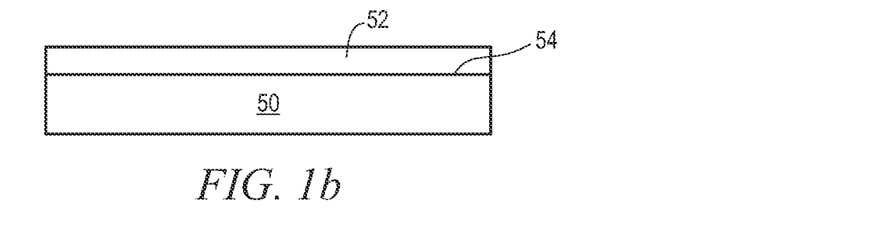
Figure 1C:
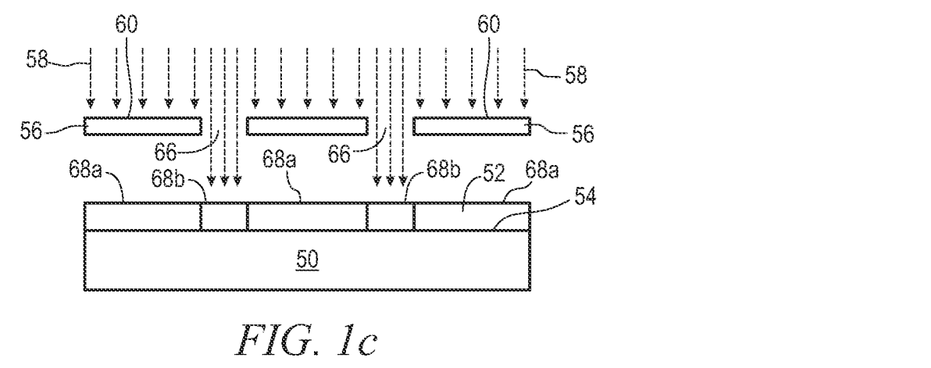
Figure 1D:
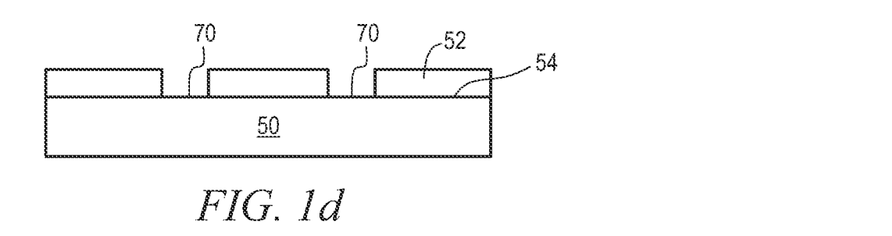
Figure 1E:
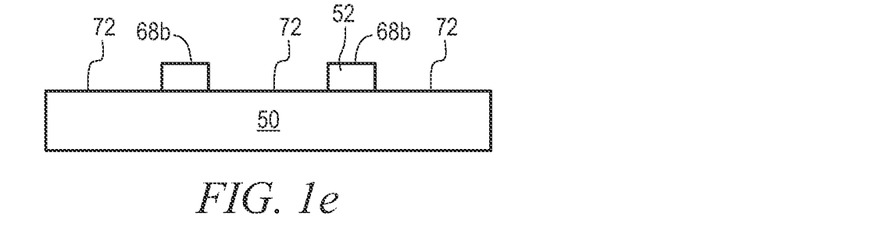

FIG. 1a illustrates semiconductor wafer 50 containing semiconductor devices. In FIG. 1B, photoresist 52 is applied to active surface 54 of semiconductor wafer 50. In FIG. 1c, mask 56 is disposed over photoresist 52. Mask 56 is a pattern that exposes or isolates areas of semiconductor wafer 50 for the semiconductor manufacturing operations. An ultra-violet (UV) light 58 is illuminated over mask 56 and exposed areas of photoresist 52. In areas 60 covered by mask 56, UV light 58 is blocked from photoresist 52. In opening 66 of mask 56, photoresist 52 is exposed to UV light 58. Mask 56 is removed. Photoresist 52 can be positive or negative in reaction. In the case of positive photoresist, area 68b of photoresist 52 is degraded by UV light 58, while area 68a is unaffected by the UV light. A developer or solvent is applied to remove areas 68b, while leaving areas 68a, as shown in FIG. 1d. Removing area 68b of photoresist 52 exposes surface 70 of semiconductor wafer 50 to semiconductor manufacturing processes, while isolating the remainder of surface 54 of the semiconductor wafer. In the case of negative photoresist, area 68b of photoresist 52 is cured or hardened by UV light 58, while area 68a remains soluble. A developer or solvent is applied to remove areas 68a, while leaving areas 68b, as shown in FIG. 1e. Removing area 68a of photoresist 52 exposed surface 72 of semiconductor wafer 50 to semiconductor manufacturing processes, while isolating the remainder of surface 54 of the semiconductor wafer.

A common design goal for a semiconductor device is to reduce the footprint and profile, while gaining in functionality. The semiconductor devices need to accommodate a higher density of components in a smaller area. For example, the demand for more input/output (I/O) and decreasing semiconductor package size require a smaller diameter and higher height for the interconnect bump. The bump height can vary from 5.0-70.0 micrometers (µm) or more. Liquid photoresist (LPR) material is often better suited to decrease bump diameter while increasing bump height. LPR is applied across the semiconductor wafer while attached to wafer suction mount and rotating in the inner cup of a wafer processing device. The rotation of the semiconductor wafer creates a negative pressure, which tends to form photoresist cotton candy (fibrous photoresist residue and other contamination resembling cotton candy) in the area below the semiconductor wafer. Photoresist cotton candy is defective material, residue, or contamination that form on the backside of semiconductor wafer when using high viscosity LPR. Furthermore, bubbles occur because high viscosity LPR is vulnerable to underlying topology, which can cause electrical shorting or cracking. One approach to reducing LPR contamination involves a double coating process with a first photoresist coat, first bake, second photoresist coat, and second bake, with limited results. The need to achieve a clean, dry, contaminate free, photoresist covered semiconductor wafer remains.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

The electrical interconnection of the active and passive electrical components requires formation of electrical interconnect structures, such as trace lines, RDL, and external contact pads. The formation of active and passive electrical components, as well as the electrical interconnect structures, utilizes a photolithographic process which requires certain areas of the semiconductor wafer to be masked off using a photoresist material to perform the semiconductor manufacturing operation in the desired area, as described in FIGS. 1a-1e in the background.

Figure 2A:
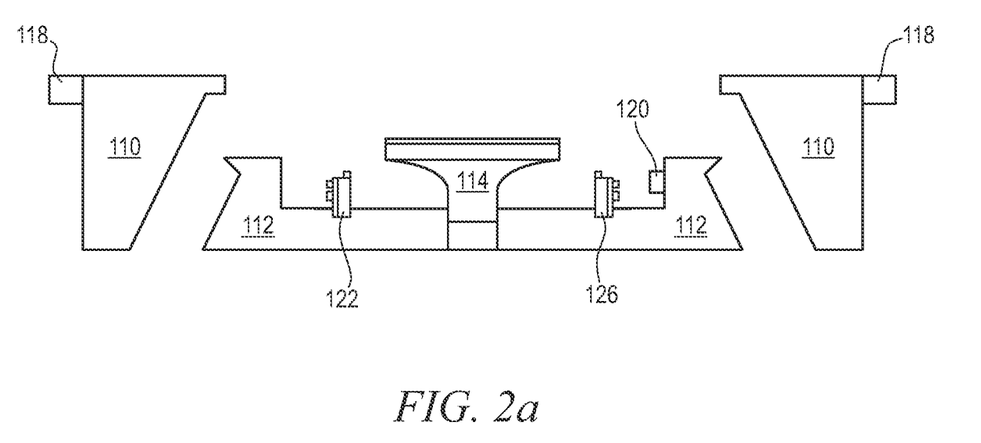
FIGS. 2a-2p illustrate a process of applying a high viscosity liquid photoresist to a semiconductor wafer using gas purge.
Figure 2B:
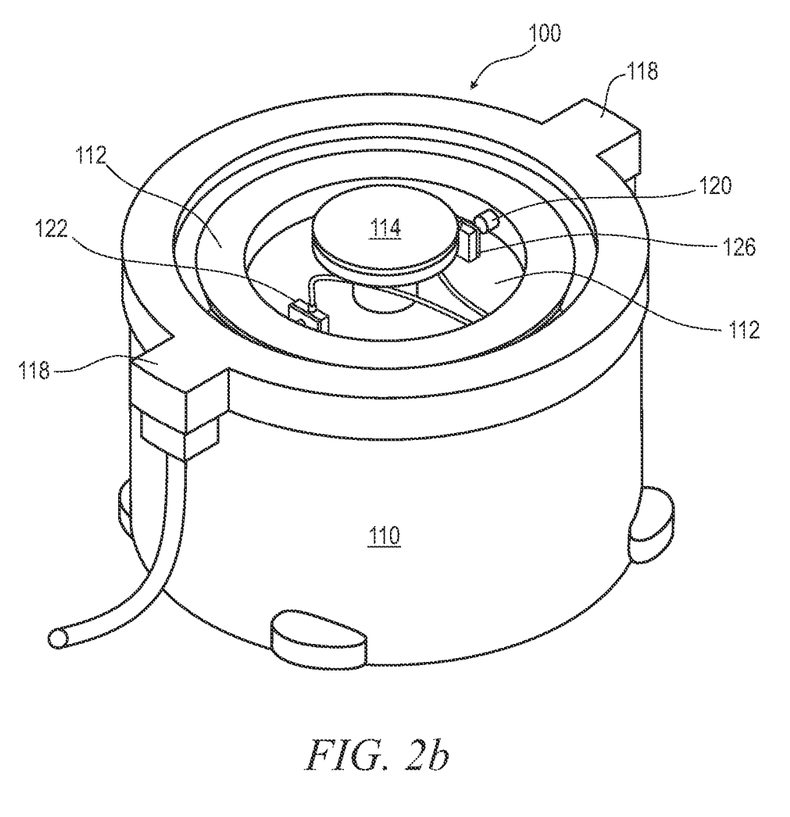
Figure 2C:
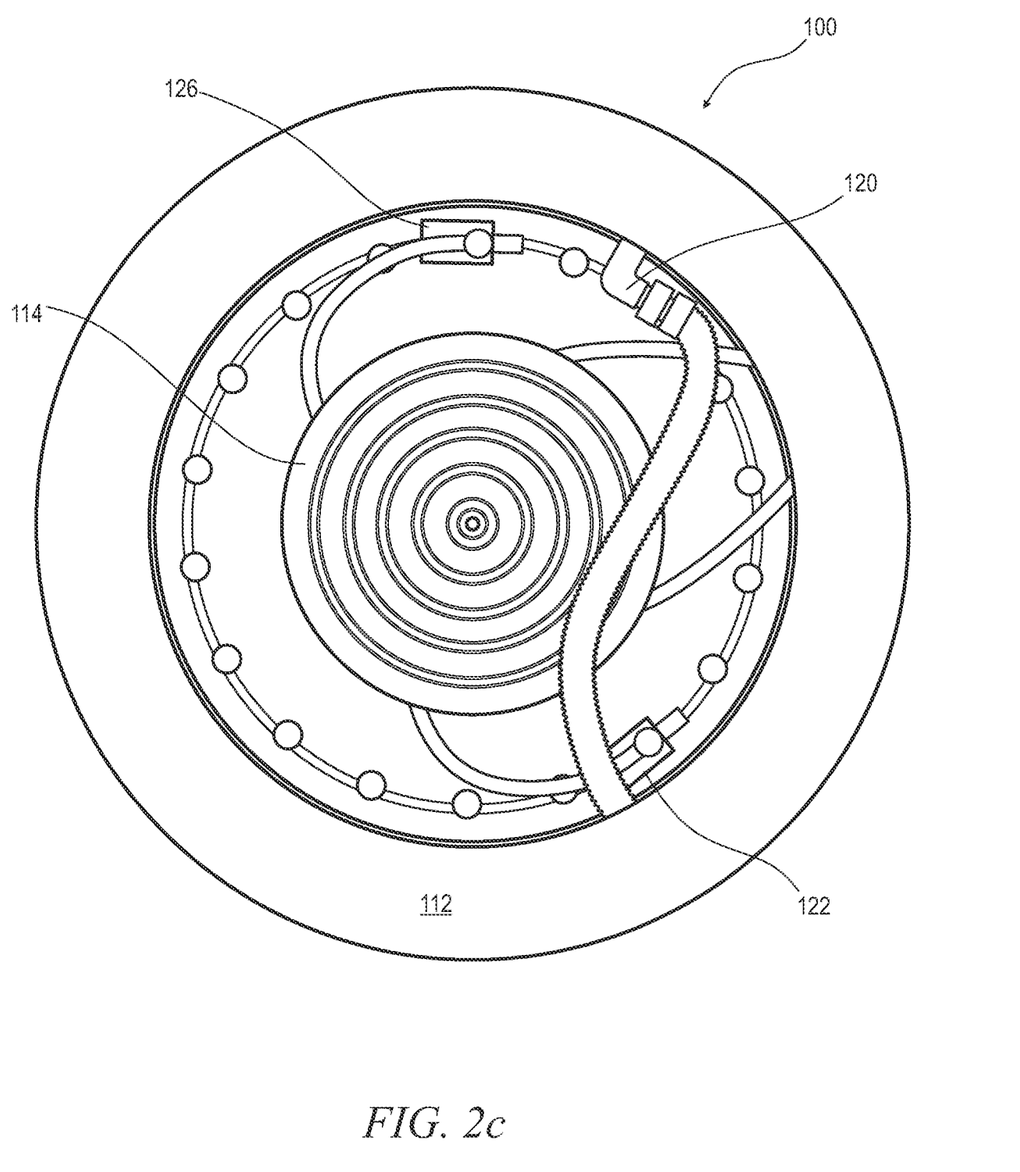
Figure 2D:
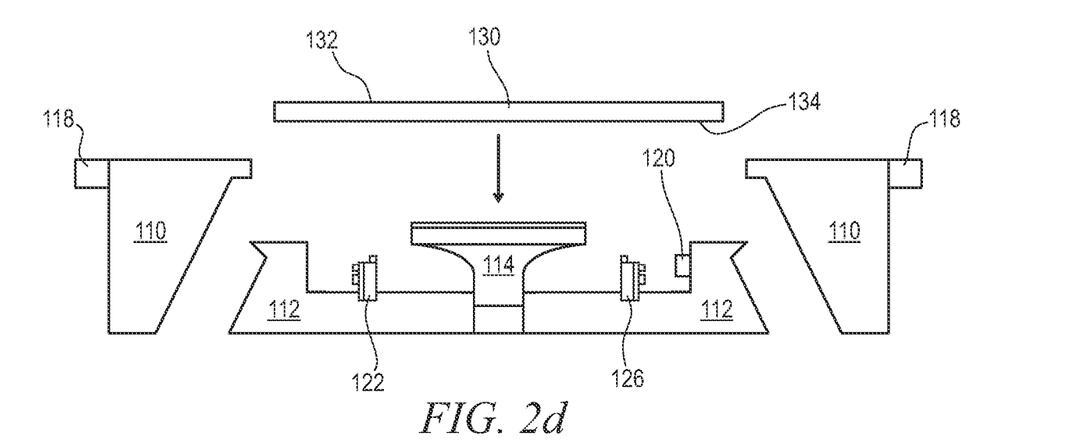
Figure 2E:
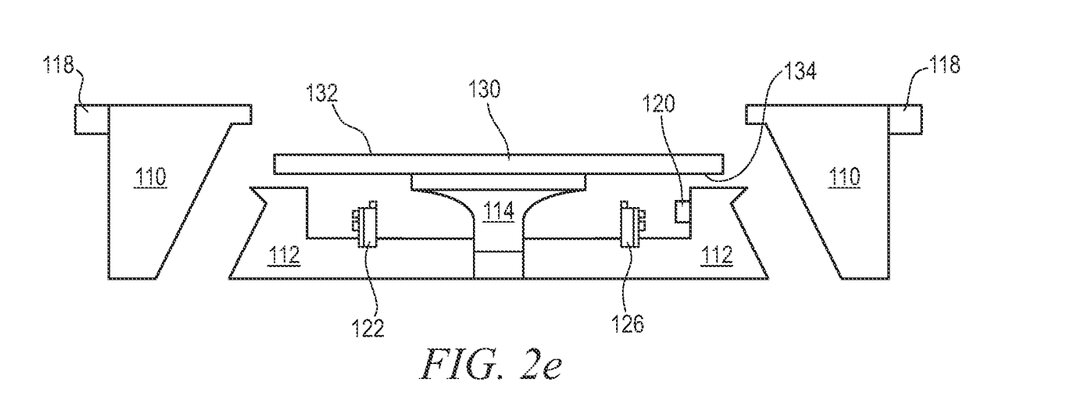
Figure 2F:
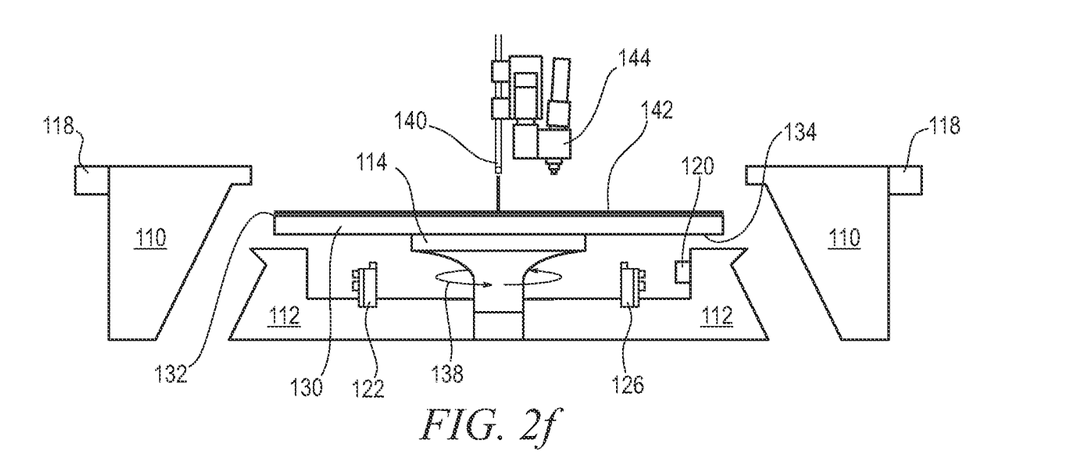
Figure 2G:
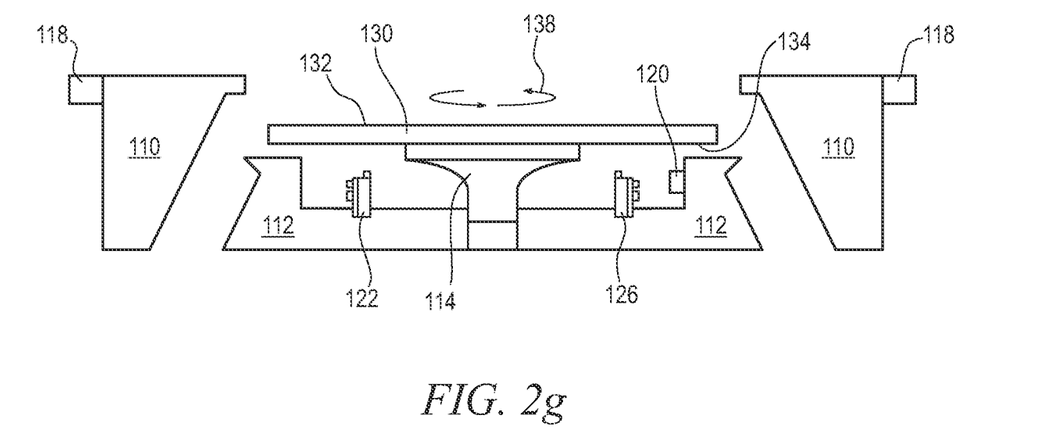
Figure 2H:
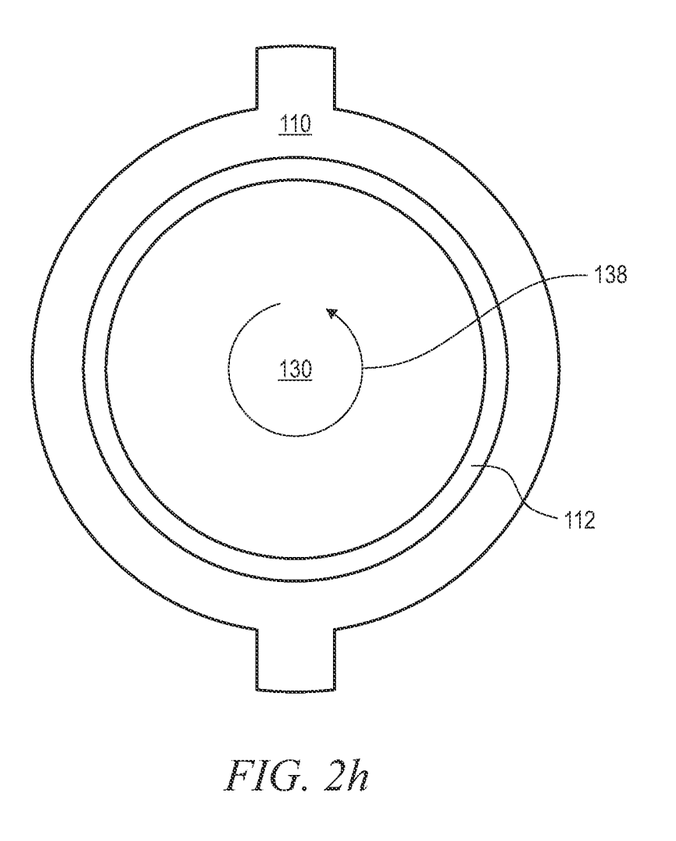
Figure 2I:
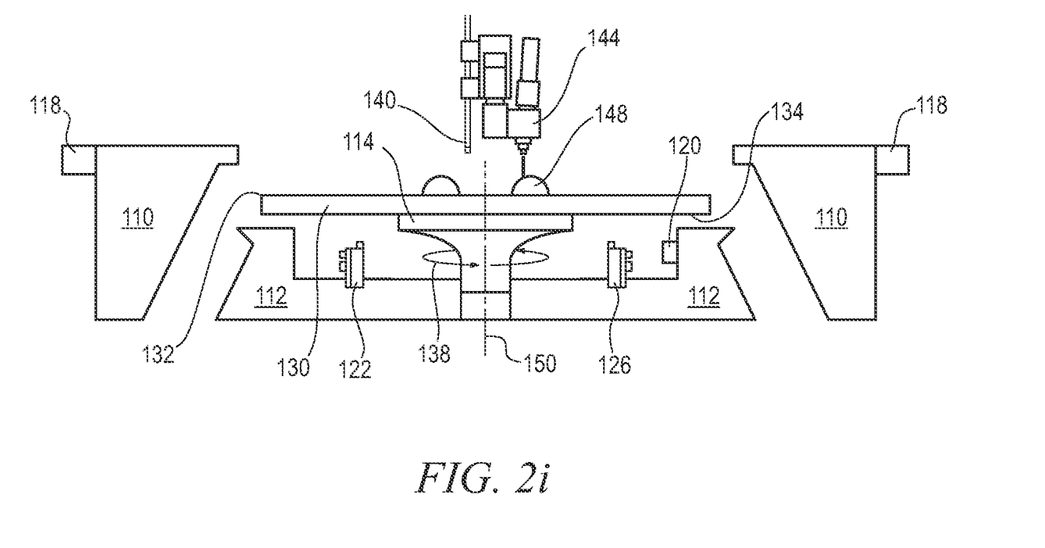
Figure 2J:
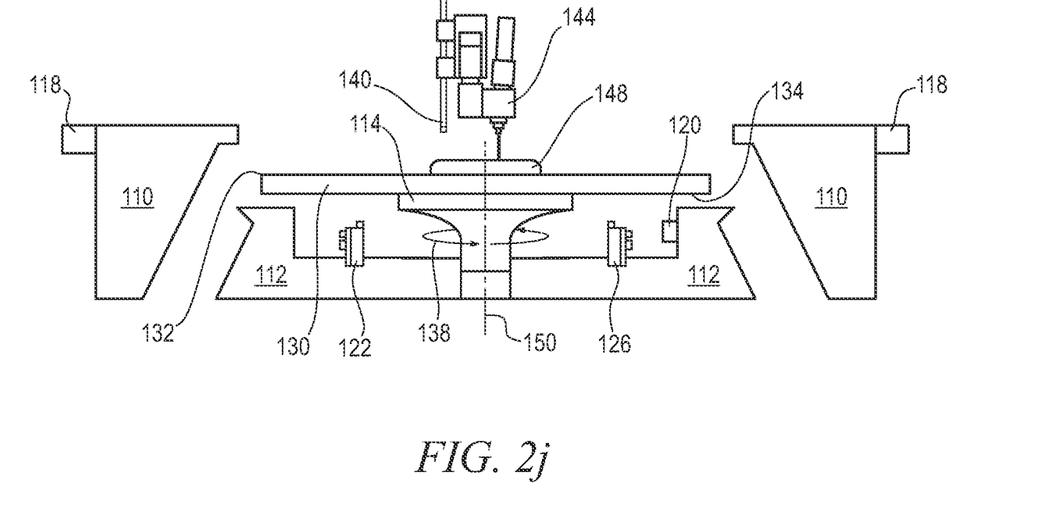
Figure 2K:
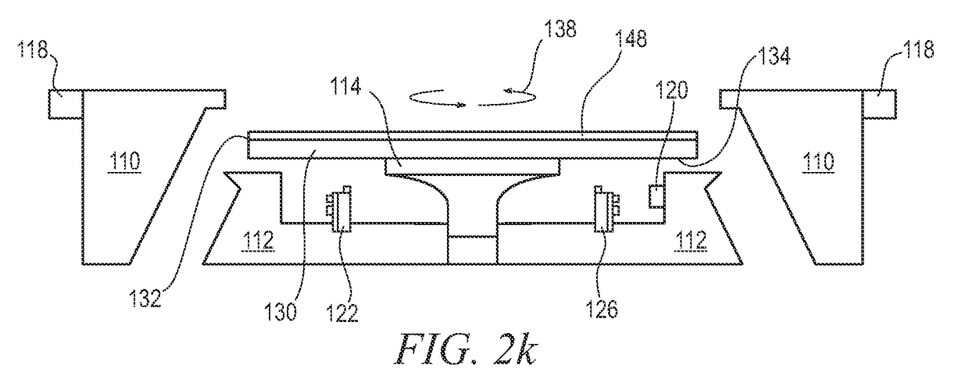
Figure 2L:
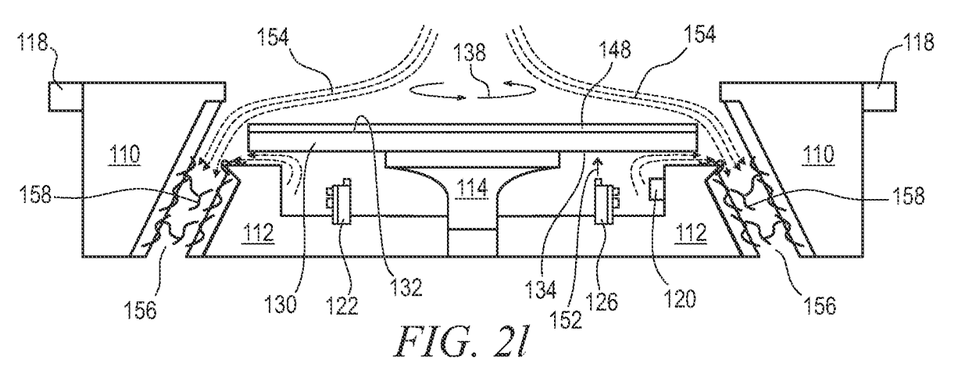
Figure 2M:
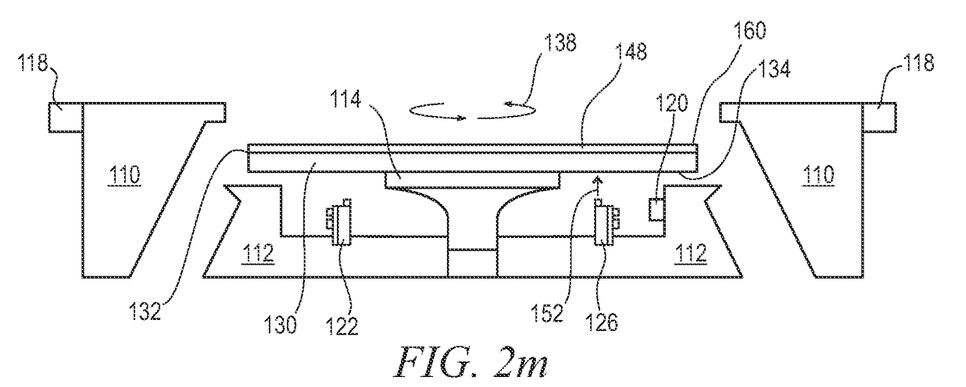
Figure 2N:
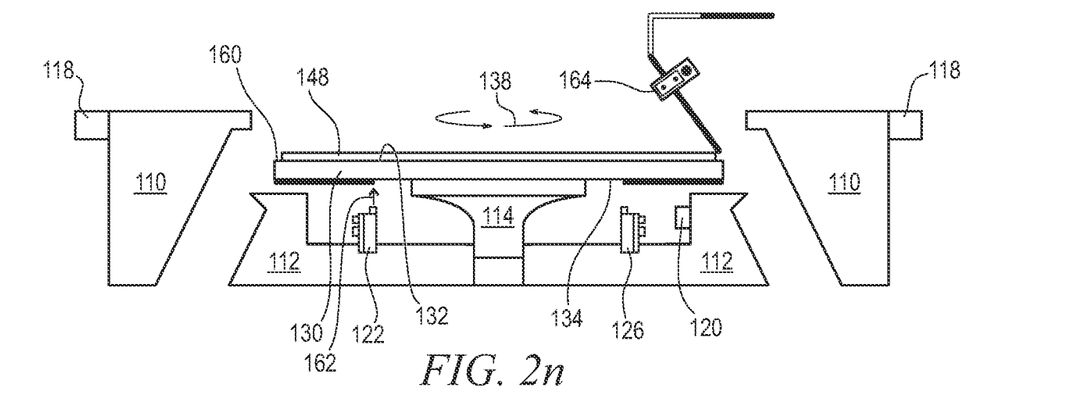
Figure 2O:
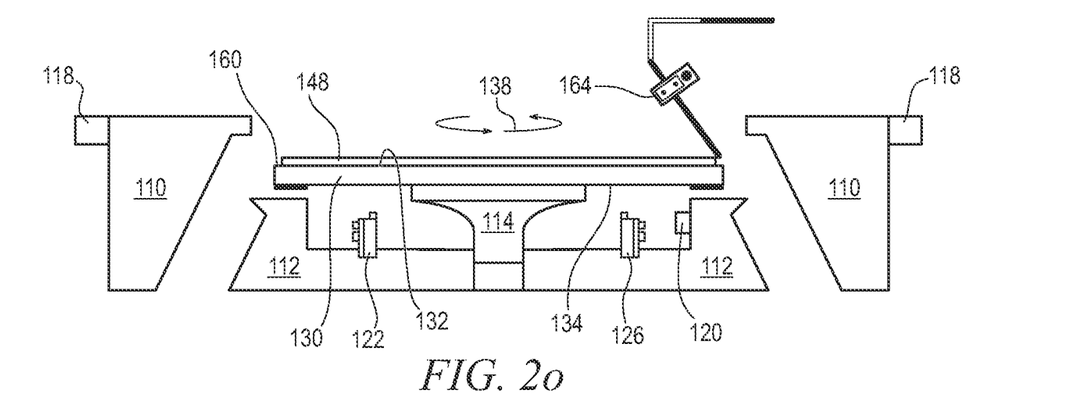
Figure 2P:
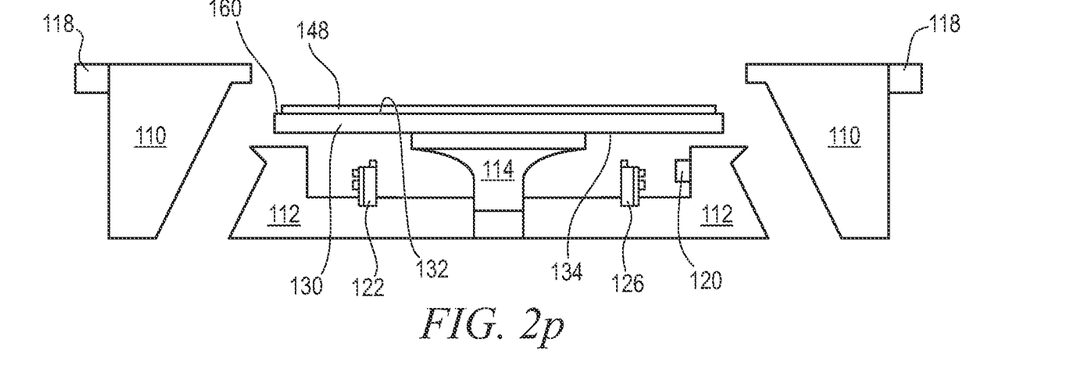

FIGS. 2a-2p illustrate a process of applying a high viscosity liquid photoresist to a semiconductor wafer using a gas purge. FIG. 2a shows a cross-sectional view of wafer processing device 100 for applying materials, such as photoresist, to the active surface of a semiconductor wafer. Wafer processing device 100 includes outer cup 110 and inner cup 112 with wafer suction mount 114. Ports 118 provide for outer cup rinse. Port 120 provides for inner cup rinse. Port or nozzle 122 provides for wafer backside rinse. Port or nozzle 126 provides gas blow or purge. FIG. 2b is a perspective view of wafer processing device 100 with outer cup 110, inner cup 112, wafer suction mount 114, and ports 118. FIG. 2c illustrates further detail of wafer suction mount 114, port 122 for wafer backside rinse, port 120 for inner cup rinse, and port 126 for gas purge.

In FIG. 2d, semiconductor wafer 130 is positioned over wafer suction mount 114 with active surface 132 oriented away from the wafer suction mount and backside surface 134 oriented toward the wafer suction mount. FIG. 2e shows semiconductor wafer 130 in contact with wafer suction mount 114. Wafer suction mount 114 draws a vacuum to apply negative pressure to backside surface 134 of semiconductor wafer 130 to hold the semiconductor wafer in place during the operations described for FIGS. 2f-2p.

In FIG. 2f, wafer suction mount 114 rotates in the direction of arrow 138 at a speed of 100 revolutions per minute (RPM). Port or nozzle 140 applies a coating 142 of propylene glycol monomethyl ether acetate (PGMEA), propylene glycol monomethyl ether (PGME), ethylene glycol monomethyl ether acetate (EGMEA), or mixed solution of PGMEA and PGME as a pre-wet step to reduce resist consumption (RRC) and minimize coating defects, such as bubbles. Port or nozzle 144 dispenses photoresist material in a later step. In FIG. 2g, wafer suction mount 114 continues to rotate semiconductor wafer 130 in the direction of arrow 138 to dry coating 142 partially. FIG. 2h is a top view of semiconductor wafer 130 rotating on wafer suction mount 114 within outer cup 110 and inner cup 112.

In FIG. 2i, port 144 dispenses a light sensitive material reactive to light and developer. In one embodiment, port 144 dispenses photoresist material 148 having a high viscosity of 7000 cp onto active surface 132 of semiconductor wafer 130. In FIG. 2i, photoresist material 148 is dispensed 8.0 millimeters (mm) away from centerline 150 of semiconductor wafer 130, as the wafer is rotating, to enhance uniformity of the thickness of the photoresist material. Alternatively, as shown in FIG. 2j, photoresist material 148 is dispensed 5.0 mm away from centerline 150 of semiconductor wafer 130, as the wafer is rotating, to enhance uniformity of the thickness of the photoresist material. The application of photoresist material 148 in FIG. 2j produces a flat surface for the photoresist material. In FIG. 2k, wafer suction mount 114 continues to rotate in the direction of arrow 138 to spin semiconductor wafer 130 and evenly distribute photoresist material 148 across active surface 132 of the semiconductor wafer.

After spreading photoresist material 148 in FIG. 2k, port 120 dispenses solution, such as PGMEA, PGME, EGMEA, or mixed solution of PMGEA and PGME to perform an inner cup rinse, while port 126 provides gas purge with arrow 152, as shown in FIG. 2l. Cotton candy is typically induced after spreading the photoresist. To remove the cotton candy, in one embodiment, nitrogen (N2 diatomic molecular gas) is used for the gas purge as a stable, inert gas. Other stable or inert gases can be discharged from port 126 to perform the gas purge with the inner cup rinse. The inner cup rinse with the gas purge induces air flow 154, which reduces or eliminates photoresist defects, such as photoresist cotton candy described in the background. In one embodiment, the gas purge has a flow rate of 10.0 liters/min. The rotation of semiconductor wafer 130 creates a negative pressure, which tends to form photoresist cotton candy in the area below the semiconductor wafer. The gas purge dislodges, expels or removes any photoresist cotton candy, defective material, photoresist residue, or other contamination 158 that may form on the backside of semiconductor wafer 130 and to pass such contamination out through rinse outlet 156 with the inner cup rinse. FIG. 2l shows defective material, residue, or contamination 158 passing through inner cup rinse outlet 156 under pressure from the gas purge. The inner cup rinse and gas purge cycle in FIG. 2l continues until defective material, residue, or contamination 158 is removed from the backside of semiconductor wafer 130. The inner cup rinse and gas purge cycle in FIG. 2l continues for 5-10 seconds. In one example, the inner cup rinse and gas purge cycle continues for 7 seconds.

In FIG. 2m, wafer suction mount 114 continues to rotate semiconductor wafer 130 at a higher or main speed. The higher or main speed of semiconductor wafer 130 is 300 revolutions per minute (RPM), while the spreading rpm is 700 RPM to control the thickness and uniformity of photoresist material 148 over active surface 132. In one embodiment, the gas purge commences after the photoresist spread in FIG. 2k, continues through rinse and purge in FIG. 2l, and discontinues at the main RPM cycle in FIG. 2m. After the main RPM step, photoresist material 148 is dried to perform an edge bead removal (EBR) region 160, which involves removal of beaded photoresist material from the edge of semiconductor wafer 130 formed during coating of the photoresist material on the semiconductor wafer. The dry cycle is about 100 RPM.

Alternatively, the gas purge and inner cup rinse may continue for at least a portion of the main RPM cycle. In this case, defective material or contamination 158 continues to pass out through rinse outlet 156 during the main RPM by nature of the gas purge prior to the main RPM and during the main RPM.

In FIG. 2n, wafer suction mount 114 continues to rotate semiconductor wafer 130 as port 122 dispenses solution such as PGMEA, PGME, EGMEA, or mixed solution of PMGEA and PGME with arrow 162 for wafer backside rinse. Port or nozzle 164 dispenses a solvent to remove EBR region 160.

In FIG. 2o, wafer suction mount 114 continues to rotate semiconductor wafer 130 as port or nozzle 164 continues to dispense solvent to remove EBR region 160 as needed. The wafer backside rinse is discontinued to allow semiconductor wafer 130 to completely dry. FIG. 2p shows semiconductor wafer 130 with a coating of photoresist material 148 and EBR region 160 removed. Semiconductor wafer 130 is clean, dry, and contaminate free, accomplished in part with the gas purge after spreading photoresist material 148 in FIG. 2i.

Figure 3A:
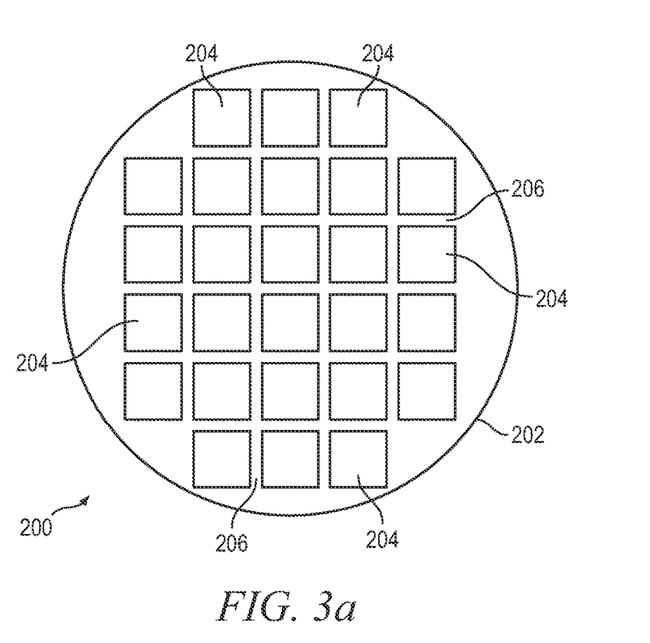
FIGS. 3a-3c illustrate a semiconductor wafer with a plurality of semiconductor die separated by a saw street.

FIG. 3a shows a semiconductor wafer 200 with a base substrate material 202, such as silicon, germanium, aluminum phosphide, aluminum arsenide, gallium arsenide, gallium nitride, indium phosphide, silicon carbide, or other bulk material for structural support. A plurality of semiconductor die or components 204 is formed on wafer 200 separated by a non-active, inter-die wafer area or saw street 206. Saw street 206 provides cutting areas to singulate semiconductor wafer 200 into individual semiconductor die 204. In one embodiment, semiconductor wafer 200 has a width or diameter of 100-450 millimeters (mm).

Figure 3B:
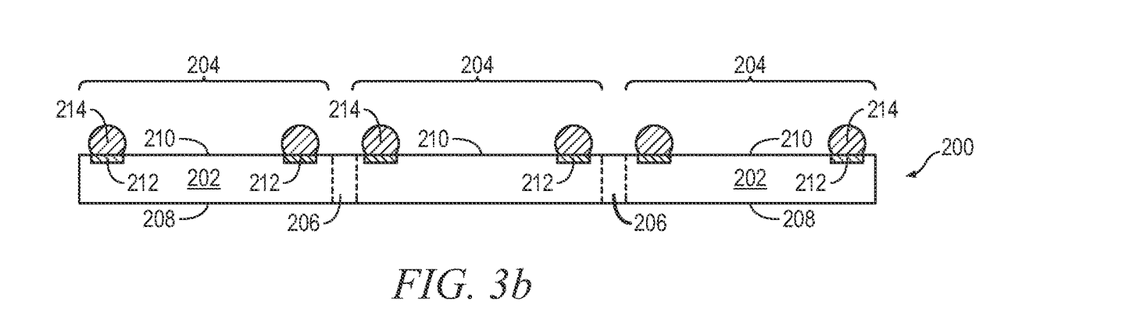

FIG. 3b shows a cross-sectional view of a portion of semiconductor wafer 200. Each semiconductor die 204 has a back or non-active surface 208 and an active surface 210 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 210 to implement analog circuits or digital circuits, such as digital signal processor (DSP), application specific integrated circuits (ASIC), memory, or other signal processing circuit. Semiconductor die 204 may also contain IPDs, such as inductors, capacitors, and resistors, for RF signal processing.

An electrically conductive layer 212 is formed over active surface 210 using PVD, CVD, electrolytic plating, electroless plating process, or other suitable metal deposition process. Conductive layer 212 can be one or more layers of aluminum (Al), copper (Cu), tin (Sn), nickel (Ni), gold (Au), silver (Ag), or other suitable electrically conductive material. Conductive layer 212 operates as contact pads electrically connected to the circuits on active surface 210.

An electrically conductive bump material is deposited over conductive layer 212 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form balls or bumps 214. In one embodiment, bump 214 is formed over an under bump metallization (UBM) having a wetting layer, barrier layer, and adhesive layer. Bump 214 can also be compression bonded or thermocompression bonded to conductive layer 212. Bump 214 represents one type of interconnect structure that can be formed over conductive layer 212. The interconnect structure can also use bond wires, conductive paste, stud bump, micro bump, or other electrical interconnect.

Figure 3C:
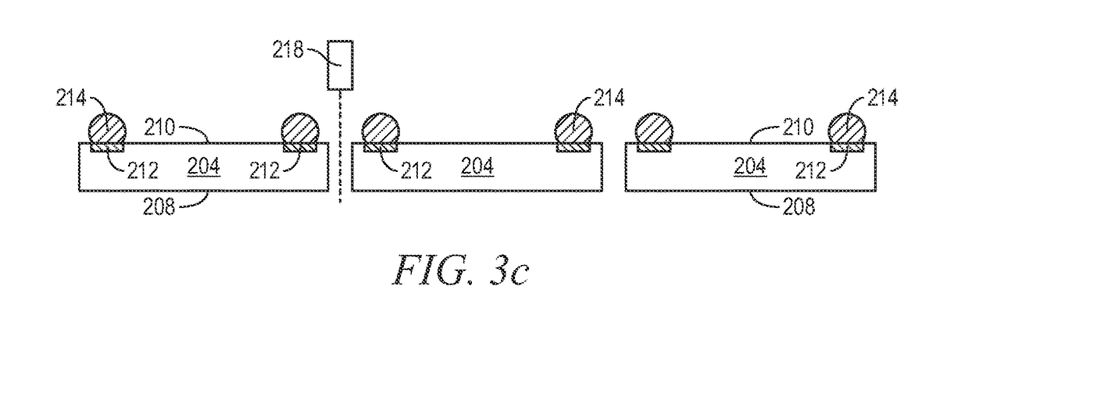

In FIG. 3c, semiconductor wafer 200 is singulated through saw street 206 using a saw blade or laser cutting tool 218 into individual semiconductor die 204. The individual semiconductor die 204 can be inspected and electrically tested for identification of KGD post singulation.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor manufacturing device, comprising:
   an outer cup;
   an inner cup disposed within the outer cup, wherein the inner cup includes a wafer suction mount adapted for mounting a semiconductor wafer;
   a gas purge port disposed on the inner cup for dispensing a gas into an area between the inner cup and a bottom side of the semiconductor wafer to move contamination into an outlet disposed between the inner cup and outer cup; and
   an inner cup rinse port disposed on the inner cup to dispense a rinse solution into the inner cup to perform an inner cup rinse, wherein the gas from the gas purge port with the inner cup rinse move the contamination into the outlet disposed between the inner cup and outer cup.

2. The semiconductor manufacturing device of claim 1, wherein the inner cup rinse port dispenses the rinse solution selected from the group consisting of containing propylene glycol monomethyl ether acetate, propylene glycol monomethyl ether, ethylene glycol monomethyl ether acetate, or a mixture thereof, to perform an inner cup rinse.

3. The semiconductor manufacturing device of claim 1, wherein the gas includes a stable or inert gas.

4. The semiconductor manufacturing device of claim 1, wherein the gas includes nitrogen.

5. The semiconductor manufacturing device of claim 1, further including a source of air flow through the outlet disposed between the inner cup and outer cup to remove contamination from the bottom side of the semiconductor wafer.

6. The semiconductor manufacturing device of claim 1, further including a wafer backside rinse port disposed on the inner cup.

7. A semiconductor manufacturing device, comprising:
   an outer cup;
   an inner cup including a wafer suction mount disposed within the outer cup;
   a gas purge port disposed on the inner cup for dispensing a gas into an area between the inner cup and a bottom side of the semiconductor wafer to move contamination into an outlet disposed between the inner cup and outer cup; and
   an inner cup rinse port disposed on the inner cup to dispense a rinse solution into the inner cup to perform an inner cup rinse, wherein the gas from the gas purge port with the inner cup rinse move the contamination into the outlet between the inner cup and outer cup.

8. The semiconductor manufacturing device of claim 7, wherein the gas purge port is adapted for dispensing a gas oriented toward a bottom side of a semiconductor wafer disposed on the wafer suction mount.

9. The semiconductor manufacturing device of claim 7, wherein the inner cup rinse port dispenses the solution selected from the group consisting of containing propylene glycol monomethyl ether acetate, propylene glycol monomethyl ether, ethylene glycol monomethyl ether acetate, or a mixture thereof, to perform an inner cup rinse.

10. The semiconductor manufacturing device of claim 7, wherein the gas includes a stable or inert gas.

11. The semiconductor manufacturing device of claim 7, wherein the gas includes nitrogen.

12. A semiconductor manufacturing device, comprising:
an outer cup;
an inner cup disposed within the outer cup and adapted for mounting a semiconductor wafer;
a gas purge port disposed on the inner cup for dispensing a gas oriented toward the semiconductor wafer to move contamination into an outlet disposed between the inner cup and outer cup; and
an inner cup rinse port disposed on the inner cup to dispense a rinse solution into the inner cup to perform an inner cup rinse, wherein the gas from the gas purge port with the inner cup rinse move the contamination into the outlet between the inner cup and outer cup.

13. The semiconductor manufacturing device of claim 12, wherein the inner cup rinse port dispenses the solution selected from the group consisting of containing propylene glycol monomethyl ether acetate, propylene glycol monomethyl ether, ethylene glycol monomethyl ether acetate, or a mixture thereof, to perform an inner cup rinse.

14. The semiconductor manufacturing device of claim 12, wherein the gas includes a stable or inert gas.

15. The semiconductor manufacturing device of claim 12, wherein the gas includes nitrogen.

16. The semiconductor manufacturing device of claim 12, further including a wafer backside rinse port disposed on the inner cup.

* * * * *